(12) United States Patent
Pavan

(10) Patent No.: US 6,323,697 B1
(45) Date of Patent: Nov. 27, 2001

(54) LOW DISTORTION SAMPLE AND HOLD CIRCUIT

(75) Inventor: Shanthi Pavan, Piscataway, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/599,917

(22) Filed: Jun. 22, 2000

Related U.S. Application Data

(60) Provisional application No. 60/209,696, filed on Jun. 6, 2000.

(51) Int. Cl.[7] .................................................. H03K 17/00
(52) U.S. Cl. .................... 327/94; 327/91; 327/93
(58) Field of Search ........................ 327/390, 589, 327/91, 94, 391, 93

(56) References Cited

U.S. PATENT DOCUMENTS 6,020,769 * 2/2000 Vallancourt .................... 327/94
6,052,000 * 4/2000 Nagaraj ........................ 327/94

OTHER PUBLICATIONS

Hui Pan, Masahiro Segami, Michael Chio, Jing Cao, Fumitoshi Hatori, Asad Abidi; "MP 2.4 A 3.3V, 12b, 50Msample/s A/D Converter in 0.6μm CMOS with over 80dB SFDR," ISSCC 2000, Session 2, Feb. 7, 2000, pp 40–41.

* cited by examiner

Primary Examiner—Tuan T. Lam
Assistant Examiner—Hiep Nguyen
(74) Attorney, Agent, or Firm—J. Dennis Moore; W. James Brady, III; Frederick J. Telecky, Jr.

(57) ABSTRACT

A circuit 100, which can be used to perform a sample and hold function, includes a switch 112 with a current patch coupled between an input node VIN and an output node VOUT. A capacitor 114 is coupled to the output node VOUT. A replica device 160 includes a current path coupled between the input node VIN and a supply voltage node VDD. A bootstrap circuit, e.g., including a bootstrap capacitor 164, is coupled between a control terminal of the first switch 112 and a control terminal of the replica device 160.

8 Claims, 3 Drawing Sheets

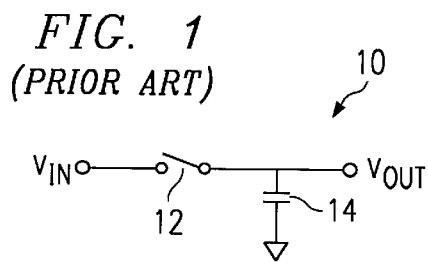
FIG. 1
(PRIOR ART)
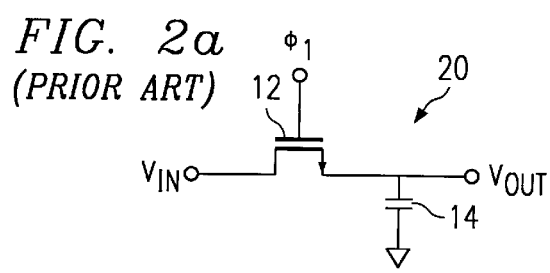
FIG. 2a
(PRIOR ART)
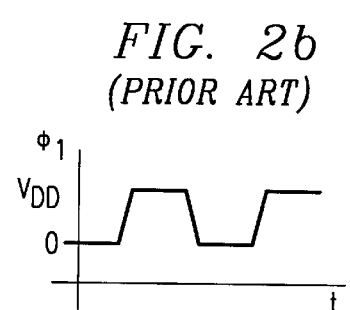
FIG. 2b
(PRIOR ART)
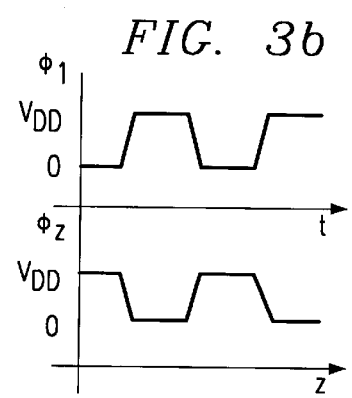
FIG. 3b
FIG. 3a
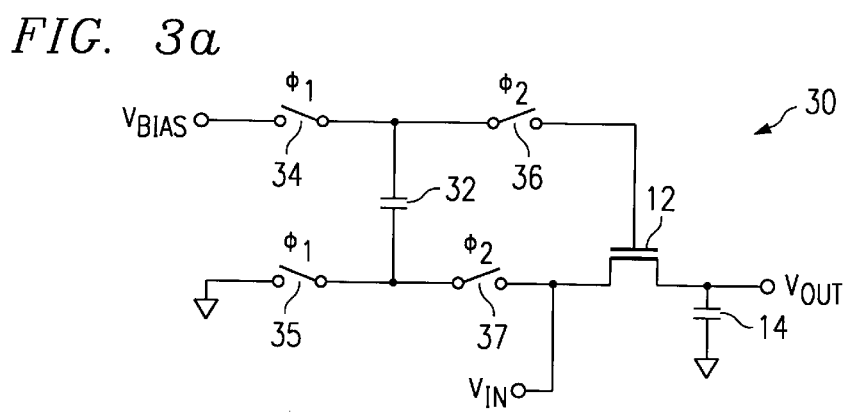
FIG. 4
(PRIOR ART)
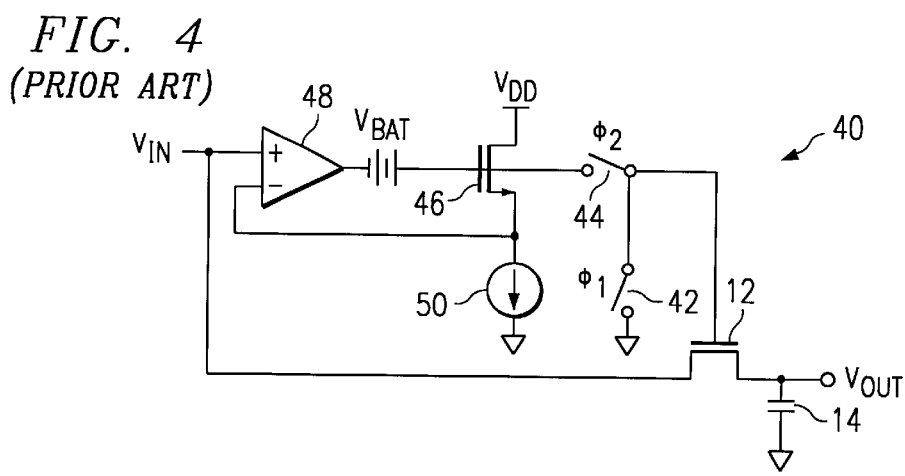

LOW DISTORTION SAMPLE AND HOLD CIRCUIT

This patent claims the benefit of the filing date of provisionally filed Patent Application No. 60/209,696, filed Jun. 6, 2000.

FIELD OF THE INVENTION

This invention relates generally to electronic circuits and specifically to a low distortion sample and hold circuit and method.

BACKGROUND OF THE INVENTION

A sample and hold circuit is a circuit that monitors a signal and provides a constant value at predetermined times. A block diagram of one such sample and hold circuit 10 is shown in FIG. 1. This circuit 10 includes a switch 12 coupled in series with a capacitor 14. In operation, the switch 12 is closed at the sample rate and the voltage across the hold capacitor 14 represents a first order held version of the input waveform $V_{in}$. In CMOS technologies, this circuit is realized as a combination of MOS transistors.

FIG. 2a shows the schematic of an elementary NMOS sample and hold circuit 20. In this implementation, switch 12 is an NMOS transistor 12. The operation of a PMOS transistor is analogous and will not be discussed here. FIG. 2b shows a timing diagram for a pulse φ1 that is applied to the gate of transistor 12. When the gating waveform φ1 goes high ($V_{DD}$), the switch 12 is on and the capacitor 14 is shorted to the input. When the input goes low (zero), the switch is off. As a result, the value of the input voltage $V_{in}$ will be held on the hold capacitor 14.

While having the benefit of being simple in construction, the circuit of FIG. 2a has a number of disadvantages. When the switch 12 is turned off, a part of the charge in the channel of the NMOS transistor 12 is dumped on to the hold capacitor 14. Since this charge is signal dependent and nonlinear, this will cause distortion. In addition, the ON resistance of the switch 12 is signal dependent thereby causing further distortion. Also, the exact sampling instant of the switch is that time at which the gate-source voltage of the switch $V_{GS}$ is about equal to the transistor's threshold voltage $V_T$. Since $V_{GS}=V_{DD}-V_{IN}$, it is clear that the sampling instant is signal dependent. This too will cause significant distortion.

To mitigate some of the problems of the single channel MOS switch discussed above, bootstrapped switches have been proposed. The idea behind bootstrapping is to keep the gate source drive of the switch constant. This is done as shown in FIG. 3, which includes FIGS. 3a and 3b.

Referring first to FIG. 3a, the circuit 30 includes a sample switch 12, comprising an NMOS transistor, and a hold capacitor 14. In this case, however, the gate of transistor 12 is coupled to a bootstrap circuit that includes bootstrap capacitor 32 and switches 34–37. FIG. 3b shows the timing of the waveforms φ1 and φ2.

During the first phase, when φ1 is high, bootstrap capacitor 32 is charged to a bias voltage $V_{BIAS}$. During the second phase, when φ2 is high, the bootstrap capacitor 32 is put across the gate and source terminals of switch 12. This ensures that the $V_{GS}$ of the MOSFET is held constant at $V_{BIAS}$ irrespective of the input voltage Vet.

The channel charge is given by $Q_{ch}=C_{ox}(V_{BIAS}-V_T(V_{IN}))$, where $C_{ox}$ is the capacitance across the gate oxide of transistor 12 and $V_T$ is the threshold voltage of transistor 12, the voltage being a function of the input voltage $V_{IN}$. From this relationship, it is thus seen that the inversion charge is substantially independent of the input voltage, except for a second order dependence through the threshold voltage.

This circuit, while exhibiting good performance, has a problem when implemented in an n-well technology. The channel charge $Q_{ch}$, and thus the switch 12 resistance, depend on the input voltage $V_{IN}$ through the threshold $V_T$. Accordingly, distortion will result.

This problem is solved by a modified arrangement proposed by Pan et al., "A 3.3V, 12b, 50 MSample/s A/D Converter in 0.6 μm CMOS with over 80 dB SFDR," IEEE International Solid State Circuit Conference, Feb. 2000, pp. 40–41. FIG. 4a illustrates such a circuit 40 and FIG. 4b shows the corresponding waveforms.

The circuit 40 includes a sample switch 12, comprising an NMOS transistor, and a hold capacitor 14. The gate of transistor is coupled to switch 42, which goes to ground, and switch 44, 16 which goes to a voltage source $V_{bat}$. In this arrangement, $V_{bat}$ is implemented as a switched capacitor level shifter. Transistor 46 is a replica of the switch device 12. Operational amplifier 48 is coupled between $V_{bat}$ and the drain of replica transistor 46. Current source 50 maintains a constant current through the transistor 46.

In operation, replica transistor 46 operates in saturation. The gate of this transistor could exceed the supply voltage $V_{dd}$. It is easily seen that if the operational amplifier is ideal, the potential at the gate of transistor 46 is given by $V_{IN}+V_T(V_{IN}+V_a)$, and the channel charge is $Q_{ch}=C_{ox}(V_a)$, where $V_a$ is a constant voltage based on the VGS-VT of transistor 46, which is dependent primarily on the current generated by current source 50. Advantageously, the channel charge $Q_{ch}$ is independent of the input voltage $V_{IN}$ and body effect.

The circuit does, however, have a number of disadvantages. Transistor 46 operates in saturation while transistor 12 operates in the triode region. Thus, their respective threshold voltages may not be equal, especially in short channel technologies. Further, the transistor 46 is subject to large variations in drain source voltages. In short channel CMOS, this is a serious problem because of the modification of the threshold of transistor 46 through drain induced barrier lowering (DIBL). Finally, the operational amplifier 48 tends to consume a lot of power if fast settling is required. Incomplete settling of the operational amplifier reduces performance.

SUMMARY OF THE INVENTION

The preferred embodiment of the present invention provides a sample and hold circuit that overcomes many of the disadvantages of the prior art circuits.

In one aspect, the present invention contemplates a circuit that which can be used to perform a sample and hold function. This circuit includes a switch, such as a MOS transistor, coupled between an input node and an output node. A capacitor is coupled to the output node. A replica device is coupled between the input node and a supply voltage node. The circuit also includes a bootstrap circuit coupled between a control terminal of the first switch and a control terminal of the replica device.

In a more specific embodiment, a sample and hold circuit is disclosed. This circuit includes a sampling transistor with a current path coupled between an input node and an output node. A hold capacitor is coupled between the output node and a reference voltage node. The circuit also includes a replica transistor with a current path coupled between a supply voltage node and the input node. This replica transistor is coupled to operate as a diode, e.g. a MOSFET with its gate coupled to its drain. A current source can also be coupled in series with the current path of the replica transistor.

This embodiment sample and hold circuit also includes a bootstrap circuit, including a bootstrap capacitor. During a first phase, the bootstrap capacitor has a bias voltage (e.g., about 2 or 3 volts) placed across it. In a second phase, the bootstrap capacitor is placed in series with the replica transistor and coupled to the gate of the sampling transistor. In one example, this can be accomplished with a number of switches, e.g., transistors.

The preferred embodiment of the present invention is capable of high speed operation since it does not require an operational amplifier. This feature also minimizes the power consumption. As another advantage, in some aspects, the replica device is closed matched to the switching device. This feature helps to minimize distortion. Further, the preferred embodiment circuit does not have problems with drain induced barrier lowering (DIBL).

BRIEF DESCRIPTION OF THE DRAWINGS

The above features of the present invention will be more clearly understood from consideration of the following descriptions in connection with accompanying drawings in which:

FIG. 1 is a prior art sample and hold circuit;

FIG. 2 is an implementation of the circuit of FIG. 1;

FIG. 3a is another example of a prior art sample and hold circuit and FIG. 3b shows the waveforms for clocking the circuit of FIG. 3a;

FIG. 4 is another example of a prior art sample and hold circuit;

FIG. 5a is a first embodiment circuit of the present invention and FIG. 5b shows the waveforms for clocking the circuit of FIG. 5a;

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The present invention will now be described with reference to a number of specific embodiments. Various ones of these embodiments provide a variety of solutions to the problems outlined above.

Figure 5A:
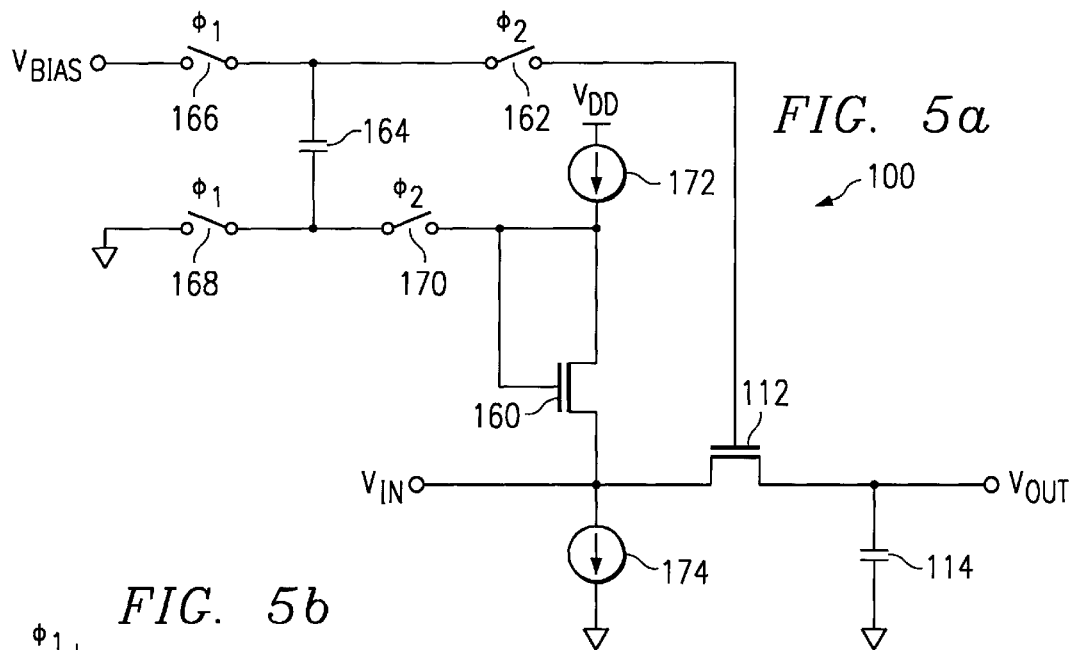
Figure 5B:
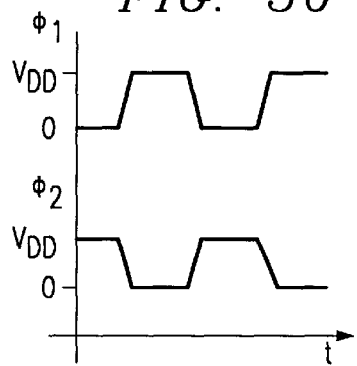

A first embodiment sample and hold circuit 100 is shown in FIG. 5a and the accompanying timing diagram for the sampling waveforms φ1 and φ2 is shown in FIG. 5b. Waveforms φ1 and φ2 are preferably non-overlapping clock signals. Circuit 100 includes a sampling transistor 112 and hold capacitor 114. In the preferred embodiment, sampling transistor 112 is an NMOS transistor but other switches such as a PMOS transistor, as an example, could alternatively be used. Concepts of the present invention could also be utilized with non-MOS technologies.

Hold capacitor 114 is preferably an integrated circuit capacitor. This element could be formed from two conductors separated by a dielectric material. As an example, one or both of the conductors might be polysilicon or another conductive material. One plate could be the semiconductor substrate. The dielectric material might be an oxide (e.g., $SiO_2$), a nitride (e.g., $Si_3N_4$), or combinations of oxides and nitride (e.g., ON, ONO, oxy-nitride). Other materials could alternatively, or additionally, be utilized.

The gate of transistor 112 is coupled to a switch 162 so that the switch 162 has a current path between the transistor 112 gate and one plate of a bootstrap capacitor 164. A second switch 166 is coupled between that plate of bootstrap capacitor 164 and a bias voltage $V_{BIAS}$. Bias voltage $V_{BIAS}$ is typically between about 2 or 3 volts. The second plate of capacitor 164 is coupled to two switches 168 and 170. Switch 168 is coupled to ground and switch 170 is coupled to the gate and source of transistor 160. In the preferred embodiment each of the switches 162, 164, 168 and 170 is formed from an NMOS transistor.

Replica transistor 160 is a diode connected MOS transistor, in this example an NMOS transistor with its drain coupled to its gate. Preferably, the conductivity type of transistor 160 is the same as that of transistor 112. In fact, transistor 160 is preferably a replica of transistor 112, having the same length, width and other characteristics. Currents are forced in and out of the replica device 160 by current sources 172 and 174. These current sources can be any known current source such as a current mirror.

During the first phase of operation, switch signal φ1 is high and causes switches 166 and 168 to be conductive. At this same time, switch signal φ2 is low causing switches 162 and 170 to be open. Clearly, if different types of switches are used (e.g., PMOS transistors) for some or all of the switches, the switch signals φ1 and/or φ2 can be modified accordingly. Referring to FIG. 5a, during this first phase, bootstrap capacitor 164 has a potential of $V_{BIAS}$ put across it.

During the second phase, when φ1 is low and φ2 is high, bootstrap capacitor 164 is put in series with transistor 160 and coupled to the gate of transistor 112. Accordingly, the voltage $V_G$ at the gate of transistor 112 can be given as $$V_G = V_{IN} + V_{T-160}(V_{IN}) + V_a + V_{BIAS}$$

The resistance of the MOSFET 112 is proportional to $V_{GS} - V_{T-112}(V_{IN})$. In these equations, $V_{T-160}$ is the threshold voltage for transistor 160 and $V_{T-112}$ is the threshold voltage for transistor 112. Since transistor 160 is a replica of transistor 112, these threshold voltages are preferably as close to equal as possible.

Of course, $V_{GS}$ is the difference between $V_G$, which is given above, and $V_s$, which is coupled to $V_{IN}$. According, $$V_{GS} = V_{T-160}(V_{IN}) + V_a + V_{BIAS}$$

and $$V_{GS} - V_{T-112}(V_{IN}) = V_{T-160}(V_{IN}) - V_{T-112}(V_{IN}) + V_a + V_{BIAS}.$$

Therefore, $V_{GS}$ is a constant ($V_a + V_{BIAS}$) when the threshold voltage of transistor 160 is equal to the threshold voltage of transistor 112. During the sample phase φ2 of operation, the channel charge is $Q_{ch} = C_{ox}(V_a)$, also a constant.

The circuit of FIG. 5a has a number of advantages. Since the channel charge and resistance are independent of input voltage $V_{IN}$, distortion can be minimized. In addition, the body effect is compensated for, at least to the first order. Further, the drain-source voltage of the switching device 12 is held constant, thereby reducing non-idealities due to finite output conductance of the MOSFET and drain induced barrier lowering (DIBL). Since no operational amplifiers are required, the circuit provides a fast, low power solution.

One issue with this circuit is that transistor 160 operation is inversion while switch 112 operations in the triode region This difference could mean that there is a difference in their threshold voltages, leading to inaccuracy.

Figure 6:
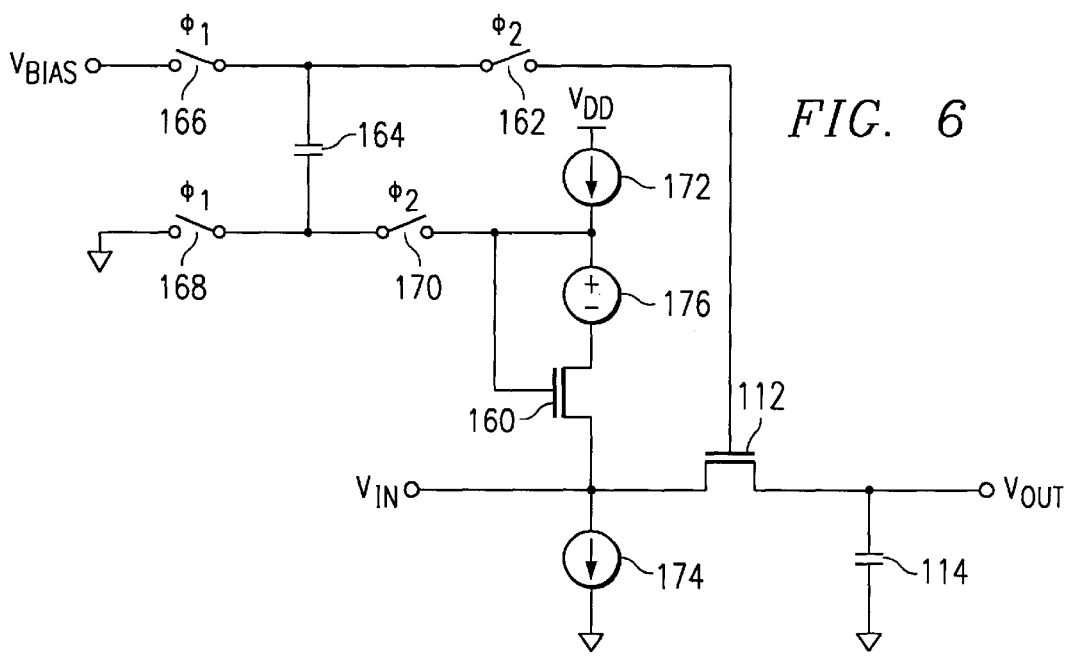
FIG. 6 is a second embodiment circuit of the present invention.

FIG. 6 shows a solution for this problem. Here, a voltage source 176 is inserted in the drain circuit of transistor 160 as shown. This voltage source 176 provides an additional voltage designed to push transistor 160 into triode mode operation, making it a better replica of the switch device 112. Hence, better performance can be expected. In the preferred embodiment, the voltage source provides a voltage equal to about a threshold voltage of replica transistor 160.

Figure 7:
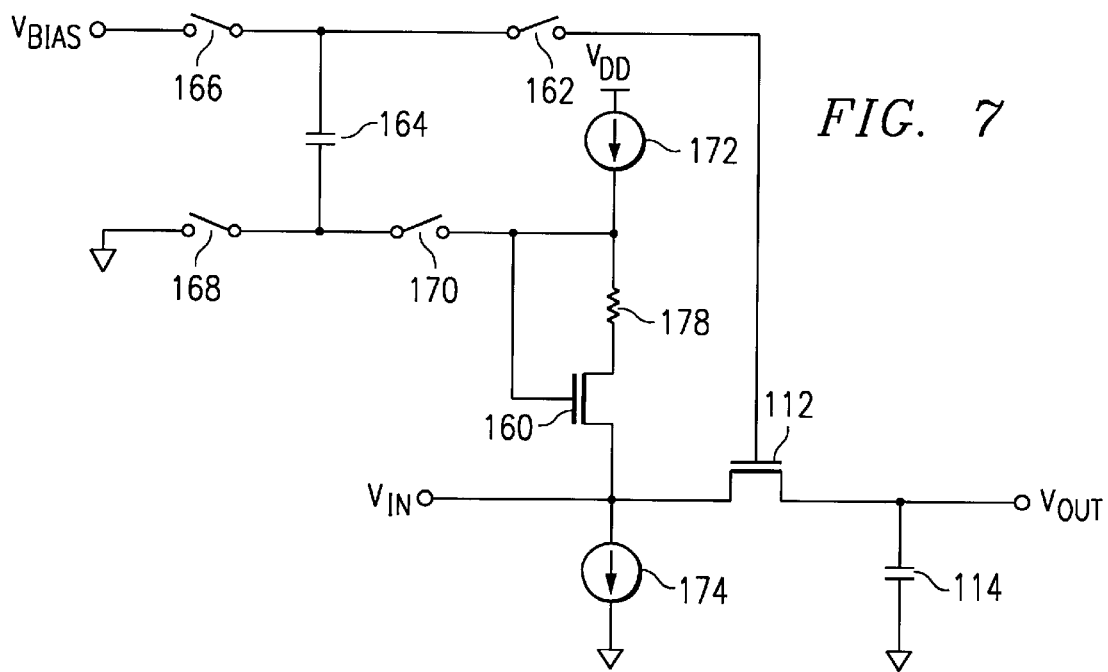
FIG. 7 is a third embodiment circuit of the present invention.
Figure 8:
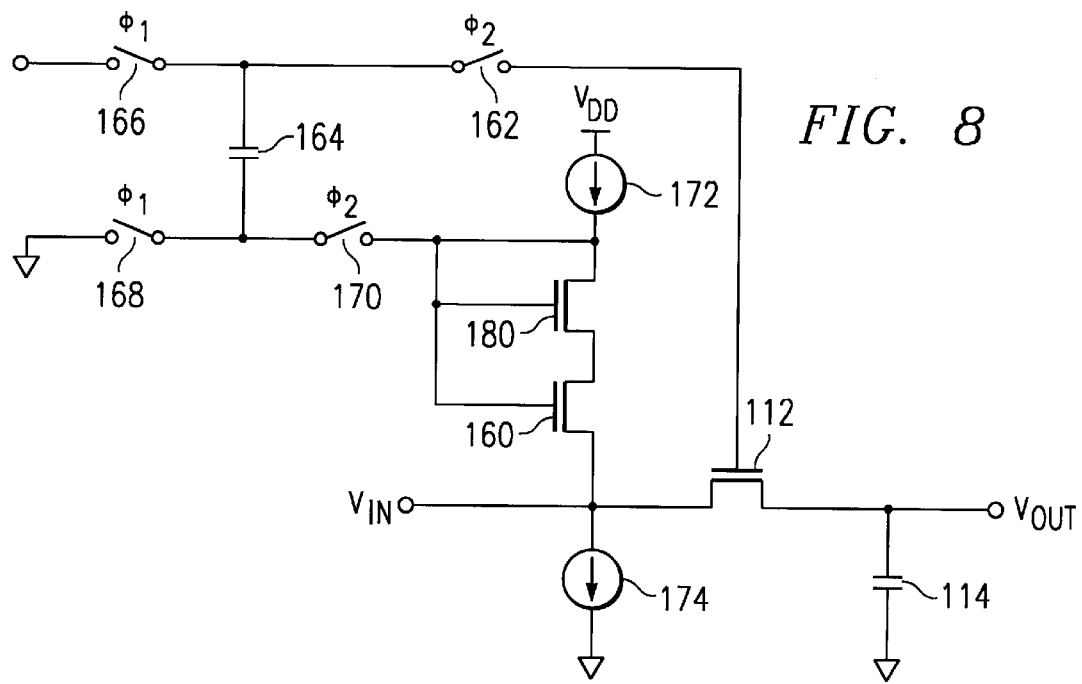
FIG. 8 is a fourth embodiment circuit of the present invention.

The voltage source 176 can be implemented in a number of ways. Two examples of implementations of the voltage source 176 are shown in FIG. 7 and FIG. 8. In FIG. 7, a resistor 178 is provided between the gate and drain of transistor 170. The voltage drop across resistor 178 is equal to the product of the current I generated by current sources 172 and 174 and the resistance of resistor 178.

In FIG. 8, a diode 180 is coupled between the gate and drain of transistor 160. In the preferred embodiment, the diode 180 comprises a diode coupled transistor with its gate coupled to its drain. As with the circuit of FIG. 7, inclusion of the diode 180 will preferably cause the replica device 160 to operate in the triode region. In fact, simulations on the circuit of FIG. 8 show a reduction in second and third harmonic distortion components of a 43 MHz sine wave sampled at 166 MHz by 6 dB and 12 dB, respectively.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a switch with a current path coupled between an input node and an output node;
   a capacitor coupled to the output node;
   a replica device with a current path coupled between the input node and a supply voltage node;
   a bootstrap circuit coupled between a control terminal of the switch and a control terminal of the replica device;
   a first current source coupled between the replica device and the supply voltage node; and
   a second current source coupled between the input node and a reference voltage node.

2. A sample and hold circuit comprising:
   a sampling transistor with a current path coupled between an input node and an output node;
   a hold capacitor coupled between the output node and a reference voltage node;
   a replica transistor with a current path coupled between a supply voltage node and the input node, the replica transistor coupled to operate as a diode;
   a current source coupled in series with the current path of the replica transistor;
   a bootstrap capacitor having first and second plates;
   a first switch coupled between the first plate and a bias voltage node, the first switch being conductive during a first phase;
   a second switch coupled between the first plate and a control terminal of the sampling transistor, the second switch being conductive during a second phase;
   a third switch coupled between the second plate and the reference voltage node, the third switch being conductive during the first phase; and
   a fourth switch coupled between the second plate and a control terminal of the replica transistor, the fourth switch being conductive during the second phase;
   wherein the current source is coupled between the replica transistor and the supply voltage node, the circuit further comprising a second current source coupled between the input node and the reference voltage node.

3. A sample and hold circuit comprising:
   a sampling transistor with a current path coupled between an input node and an output node;
   a hold capacitor coupled between the output node and a reference voltage node;
   a replica transistor with a current path coupled between a supply voltage node and the input node, the replica transistor coupled to operate as a diode;
   a current source coupled in series with the current path of the replica transistor;
   a bootstrap capacitor having first and second plates;
   a first switch coupled between the first plate and a bias voltage node, the first switch being conductive during a first phase;
   a second switch coupled between the first plate and a control terminal of the sampling transistor, the second switch being conductive during a second phase;
   a third switch coupled between the second plate and the reference voltage node, the third switch being conductive during the first phase;
   a fourth switch coupled between the second plate and a control terminal of the replica transistor, the fourth switch being conductive during the second phase; and
   a voltage source coupled between the replica transistor and the supply voltage node.

4. A sample and hold circuit comprising:
   a sampling transistor with a current path coupled between an input node and an output node;
   a hold capacitor coupled between the output node and a reference voltage node;
   a replica transistor with a current path coupled between a supply voltage node and the input node, the replica transistor coupled to operate as a diode;
   a current source coupled in series with the current path of the replica transistor;
   a bootstrap capacitor having first and second plates;
   a first switch coupled between the first plate and a bias voltage node, the first switch being conductive during a first phase;
   a second switch coupled between the first plate and a control terminal of the sampling transistor, the second switch being conductive during a second phase;
   a third switch coupled between the second plate and the reference voltage node, the third switch being conductive during the first phase;
   a fourth switch coupled between the second plate and a control terminal of the replica transistor, the fourth switch being conductive during the second phase; and a voltage source coupled between the gate of the replica transistor and the drain of the replica transistor.

5. A sample and hold circuit disposed between a voltage source and ground and including an input terminal and an output terminal, comprising:

a hold capacitor coupled between the output terminal and ground;

a first MOS transistor coupled by its source and drain between the input terminal and the output terminal, and having a gate;

a first current source coupled between the input terminal and ground;

a diode connected MOS transistor coupled between the input terminal and coupled to the voltage source through a second current source;

a bootstrap circuit for applying a bias voltage to the common terminal of the second current source and the diode connected MOS transistor and the gate of the first MOS transistor.

6. A sample and hold circuit disposed between a voltage source and ground and including an input terminal and an output terminal, comprising:

a hold capacitor coupled between the output terminal and ground;

a first MOS transistor coupled by its source and drain between the input terminal and the output terminal, and having a gate;

a first current source coupled between the input terminal and ground;

a second MOS transistor coupled by way of its source and drain between the input terminal and a voltage source connected in series, and having its gate connected to the common connection node of a second current source and the voltage source; and a bootstrap circuit for applying a bias voltage to the common connection node of the second current source and the voltage source and the gates of first and second MOS transistors.

7. A sample and hold circuit as in claim 6 wherein the second current source is a resistor.

8. A sample and hold circuit as in claim 6 wherein the second current source is a third, diode connected MOS transistor.

* * * * *